(12) United States Patent
Wong et al.

(10) Patent No.: US 8,951,875 B2
(45) Date of Patent: Feb. 10, 2015

(54) SEMICONDUCTOR STRUCTURE

(71) Applicant: Taiwan Semiconductor Manufacturing Company, Ltd., Hsinchu (TW)

(72) Inventors: King-Yuen Wong, Hsinchu (TW); Ming-Lung Cheng, Qieding Township (TW); Chien-Tai Chan, Hsinchu (TW); Da-Wen Lin, Hsinchu (TW); Chung-Cheng Wu, Ju-Bei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/710,078

(22) Filed: Dec. 10, 2012

(65) Prior Publication Data

US 2013/0099326 A1     Apr. 25, 2013

Related U.S. Application Data

(63) Continuation of application No. 13/042,539, filed on Mar. 8, 2011, now Pat. No. 8,357,579.

(60) Provisional application No. 61/418,105, filed on Nov. 30, 2010.

(51) Int. Cl.
*H01L 21/00* (2006.01)
*H01L 29/78* (2006.01)
(Continued)

(52) U.S. Cl.
CPC ........ *H01L 29/7833* (2013.01); *H01L 29/1083* (2013.01); *H01L 29/165* (2013.01); *H01L 29/66636* (2013.01); *H01L 29/7834* (2013.01)
USPC ............ 438/300; 438/301; 438/303; 438/305

(58) Field of Classification Search
CPC ......... H01L 21/20; H01L 21/36; H01L 21/38; H01L 21/02694
USPC ............................ 257/213–413; 438/142–308
See application file for complete search history.

(56) References Cited

U.S. PATENT DOCUMENTS 5,698,881 A   12/1997  Yoshitomi et al.
5,908,313 A    6/1999  Chau et al.
(Continued)

OTHER PUBLICATIONS

Hirao, T., et al., "Depth Distribution of Knock-On Nitrogen in Si by Phosphorus Implantation Through Si3N4 Films", Applied Physics Letters, vol. 31, No. 8, Oct. 15, 1977, pp. 505-508.
(Continued)

*Primary Examiner* — Charles Garber
*Assistant Examiner* — Evren Seven
(74) *Attorney, Agent, or Firm* — Lowe Hauptman & Ham, LLP

(57) ABSTRACT

A semiconductor structure includes a substrate, a gate structure, and two silicon-containing structures. The substrate includes two recesses defined therein and two doping regions of a first dopant type. Each of the two doping regions extends along a bottom surface and at least portion of a sidewall of a corresponding one of the two recesses. The gate structure is over the substrate and between the two recesses. The two silicon-containing structures are of a second dopant type different from the first dopant type. Each of the two silicon-containing structures fills a corresponding one of the two recesses, and an upper portion of each of the two silicon-containing structures has a dopant concentration higher than that of a lower portion of each of the two silicon-containing structures.

16 Claims, 15 Drawing Sheets

(51) Int. Cl.
*H01L 29/10* (2006.01)
*H01L 29/165* (2006.01)
*H01L 29/66* (2006.01)

(56) References Cited

U.S. PATENT DOCUMENTS

| | | | | |
|---|---|---|---|---|
| 6,642,133 | B2* | 11/2003 | Roberds et al. | 438/595 |
| 6,787,847 | B2* | 9/2004 | Disney | 257/328 |
| 6,812,103 | B2 | 11/2004 | Wang et al. | |
| 7,402,497 | B2 | 7/2008 | Wei et al. | |
| 7,402,870 | B2 | 7/2008 | Chen et al. | |
| 7,618,866 | B2* | 11/2009 | Luo et al. | 438/285 |
| 7,670,923 | B1 | 3/2010 | Nayak et al. | |
| 7,754,556 | B2 | 7/2010 | Feudel et al. | |
| 7,859,013 | B2* | 12/2010 | Chen et al. | 257/190 |
| 7,932,136 | B2* | 4/2011 | Hua et al. | 438/151 |
| 7,936,036 | B2 | 5/2011 | Tanaka et al. | |
| 7,960,798 | B2* | 6/2011 | Luo et al. | 257/396 |
| 7,977,180 | B2 | 7/2011 | Waite et al. | |
| 8,017,487 | B2* | 9/2011 | Chong et al. | 438/300 |
| 8,236,632 | B2* | 8/2012 | Fried et al. | 438/151 |
| 8,241,973 | B2* | 8/2012 | Griebenow et al. | 438/198 |
| 8,390,058 | B2* | 3/2013 | Yilmaz et al. | 257/328 |
| 2003/0234422 | A1 | 12/2003 | Wang et al. | |
| 2004/0070035 | A1* | 4/2004 | Murthy et al. | 257/408 |
| 2004/0084735 | A1 | 5/2004 | Murthy et al. | |
| 2005/0184311 | A1 | 8/2005 | Murthy et al. | |
| 2006/0043482 | A1* | 3/2006 | Burnett et al. | 257/344 |
| 2008/0023752 | A1* | 1/2008 | Chen et al. | 257/327 |
| 2008/0199999 | A1* | 8/2008 | Weijtmans et al. | 438/285 |
| 2008/0242032 | A1* | 10/2008 | Chakravarthi et al. | 438/285 |
| 2009/0020786 | A1 | 1/2009 | Lenoble et al. | |
| 2010/0013012 | A1 | 1/2010 | Cai | |
| 2010/0038727 | A1* | 2/2010 | Chakravarthi et al. | 257/408 |
| 2011/0027955 | A1 | 2/2011 | Woon et al. | |
| 2011/0256681 | A1 | 10/2011 | Lin et al. | |
| 2011/0309424 | A1 | 12/2011 | Wei et al. | |
| 2012/0001228 | A1* | 1/2012 | Chong et al. | 257/190 |
| 2012/0112290 | A1* | 5/2012 | Utomo et al. | 257/369 |
| 2012/0187490 | A1* | 7/2012 | Fried et al. | 257/347 |
| 2012/0313144 | A1* | 12/2012 | Zhang et al. | 257/192 |

OTHER PUBLICATIONS

Uchino, Takashi, et al., "MOSFETs with Ultrashallow Junction and Minimum Drain Area Formed by Using Solid-Phase Diffusion form SiGe", IEEE Transactions on Electron Devices, vol. 48, No. 7, Jul. 2001, pp. 1406-1411.

* cited by examiner

US 8,951,875 B2

SEMICONDUCTOR STRUCTURE

CROSS-REFERENCES TO RELATED APPLICATIONS

The present application is a continuation of U.S. application Ser. No. 13/042,539, filed Mar. 8, 2011, which claims the priority of U.S. Provisional Application No. 61/418,105, filed Nov. 30, 2010, which are incorporated herein by reference in their entireties.

TECHNICAL FIELD

The present disclosure relates generally to the field of semiconductor devices, and more particularly, to methods of forming integrated circuits.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
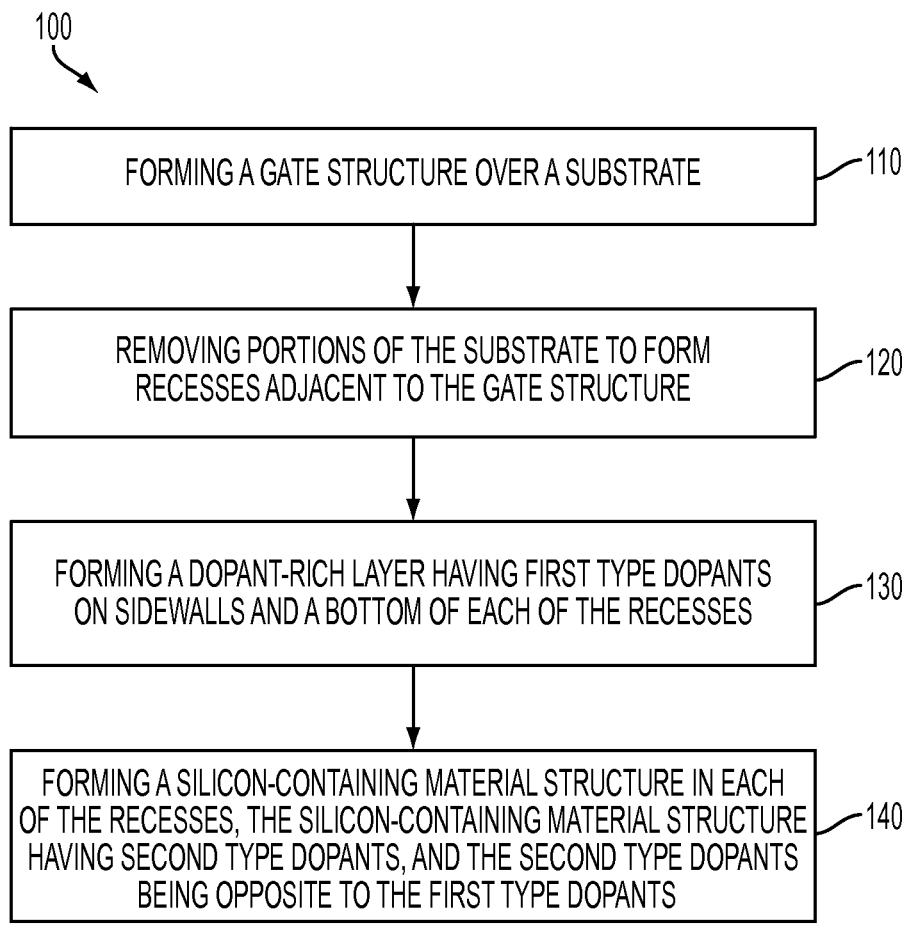
FIG. 1 is a flowchart illustrating an exemplary method of forming an integrated circuit in accordance with some embodiments.

Generally, a plurality of ion implantations have been implemented for forming source/drain (S/D) regions, lightly-doped drain (LDD) regions, and pocket regions of transistors. For example, an N-type source/drain (NSD) process has a phosphorus ion implantation that is provided to form a gradient dopant junction profile in a substrate. A carbon ion implantation is then performed to the S/D regions to prevent over diffusion of phosphorus dopants into the substrate. An arsenic ion implantation and a phosphorus implantation are performed to form S/D doped regions. After the multiple ion implantations, a rapid thermal anneal (RTA) is performed to activate dopants and cure damage resulting from the ion implantations. Silicde is then formed at the top of the S/D doped regions.

As noted, the process described above uses the phosphorus ion implantation to form the junction profile. When transistors are scaling down, the S/D junction profile may be too deep. The multiple ion implantations may also substantially damage the S/D regions. To cure the damage, a high thermal budget, e.g., a higher RTA temperature of about 1050° C. and/or a longer RTA time, may be applied. The high thermal budget may aggravate short-channel effect (SCE) of the transistors. If a low thermal budget is applied, implantation damage may not be desirably cured. Thus, the subsequent thermal budget may also result in a transient-enhanced diffusion (TED).

One of the key issues of scaling down CMOS is how to optimize the LDD junction in order to alleviate the short channel effect (SCE). Ion implantation through a dielectric layer is widely utilized to minimize the implanted defects. However, in those technologies, end-of-range defects are intrinsic, so the device performance such as SCE is degraded. In addition, the shadow effect resulting from the pitch reduction is undesired.

It is understood that the following descriptions provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Illustrated in FIG. 1 is a flowchart of an exemplary method of forming an integrated circuit. FIGS. 2A-2G are schematic cross-sectional views of an integrated circuit during various fabrication stages. The integrated circuit may include various passive and active microelectronic devices, such as resistors, capacitors, inductors, diodes, metal-oxide-semiconductor field effect transistors (MOSFET), complementary MOS (CMOS) transistors, bipolar junction transistors (BJT), laterally diffused MOS (LDMOS) transistors, high power MOS transistors, FinFET transistors, or other types of transistors. It is understood that FIGS. 2A-2G have been simplified for a better understanding of the concepts of the present disclosure.

Accordingly, it should be noted that additional processes may be provided before, during, and after the method 100 of FIG. 1, and that some other processes may only be briefly described herein.

Referring now to FIG. 1, the method 100 can include forming a gate structure over a substrate (block 110). The method 100 can include removing portions of the substrate to form recesses adjacent to the gate structure (block 120). The method 100 can include forming a dopant-rich layer having first type dopants on a sidewall and a bottom of each of the recesses (block 130). The method 100 can also include forming a silicon-containing material structure in each of the recesses (block 140). The silicon-containing material structure has second type dopants. The second type dopants are opposite to the first type dopants. In some embodiments, the first and second type dopants can each be electron donors or electron acceptors.

Figure 2A:
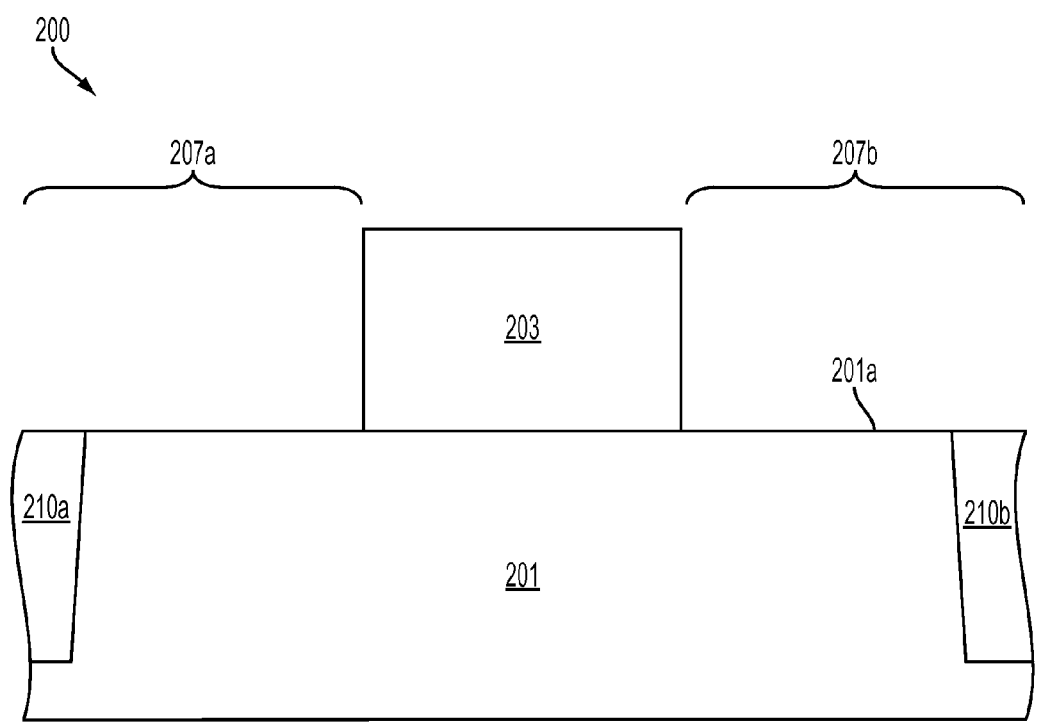
FIGS. 2A-2G are schematic cross-sectional views of an integrated circuit during various fabrication stages according to the method depicted in FIG. 1.

Referring now to FIGS. 2A-2G in conjunction with FIG. 1, an integrated circuit 200 can be fabricated in accordance with the method 100 of FIG. 1. In FIG. 2A, the integrated circuit 200 can have a substrate 201. In some embodiments, the substrate 201 can be a silicon substrate doped with dopants, such as boron, arsenic, or phosphorus. In other embodiments, the substrate 201 may alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrate 201 could include an epitaxial layer (epi layer), may be strained for performance enhancement, and may include a silicon-on-insulator (SOI) structure.

In some embodiments, shallow trench isolation (STI) features 210a and 210b may be formed in the substrate 201. The STI features 210a and 210b are formed by etching recesses (or trenches) in the substrate 201 and filling the recesses with a dielectric material. In some embodiments, the dielectric material of the STI features 210a and 210b includes silicon oxide. In some alternative embodiments, the dielectric material of the STI features 210a and 210b may include silicon nitride, silicon oxy-nitride, fluoride-doped silicate (FSG), a low-k dielectric material, other dielectric materials, or any combinations thereof.

Referring again to FIG. 2A, a gate structure 203 can be formed over a surface 201a of the substrate 201. In some embodiments forming an N-type transistor, the integrated circuit 200 can include source/drain (S/D) regions, e.g., S/D regions 207a and 207b, adjacent to sidewalls of the gate structure 203. In some embodiments, the gate structure 203 can be a conductive gate structure, e.g., a polysilicon gate structure, a metal gate structure, a dummy gate structure, or any suitable gate structure. For example, a conductive gate structure can have a stack structure including a gate dielectric layer, a conductive material layer, and/or other suitable layers. A metal gate structure can have a stack structure including a high dielectric constant gate layer, a diffusion barrier layer, a metal work function layer, a metallic layer, and/or other suitable layers. A dummy gate structure can have a stack structure including a dummy material layer, a hard mask layer, and/or other suitable layers.

Figure 2B:
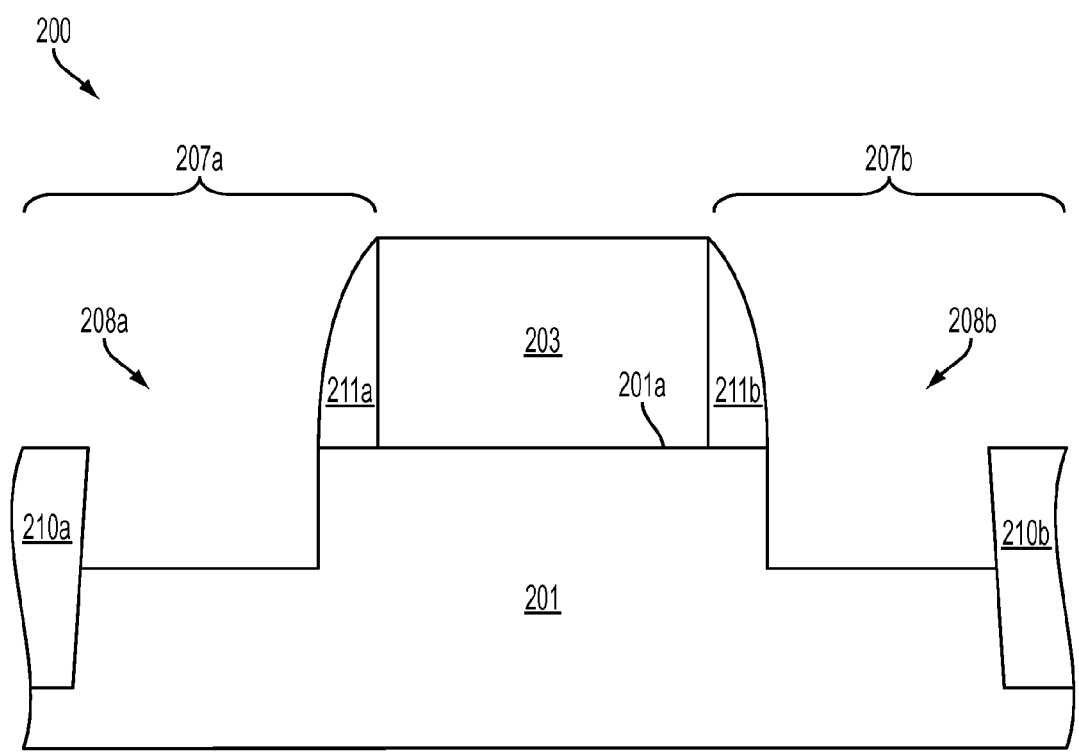

Referring to FIGS. 1 and 2B, the method 100 can include removing portions of the substrate to form recesses adjacent to the gate structure (block 120). For example, recesses 208a and 208b are formed in the substrate 201 and adjacent to the gate structure 203 as shown in FIG. 2B. In some embodiments, spacers 211a and 211b can be formed on the sidewalls of the gate structure 203. The recesses 208a and 208b can be adjacent to the spacers 211a and 211b, respectively. In some embodiments, the spacers 211a and 211b can be made of at least one material, such as silicon nitride, silicon oxynitride, silicon carbide, silicon oxycarbide, other spacer materials, or any combinations thereof. In some embodiments, the spacers 211a and 211b can be referred to as offset spacers.

Figure 2C:
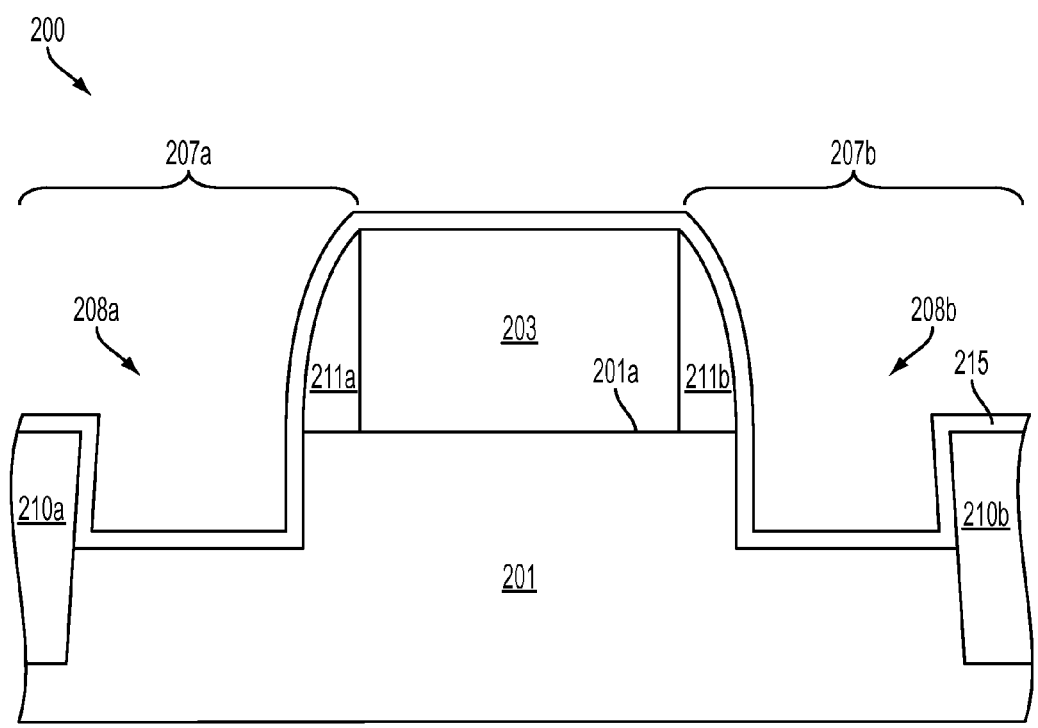
Figure 2D:
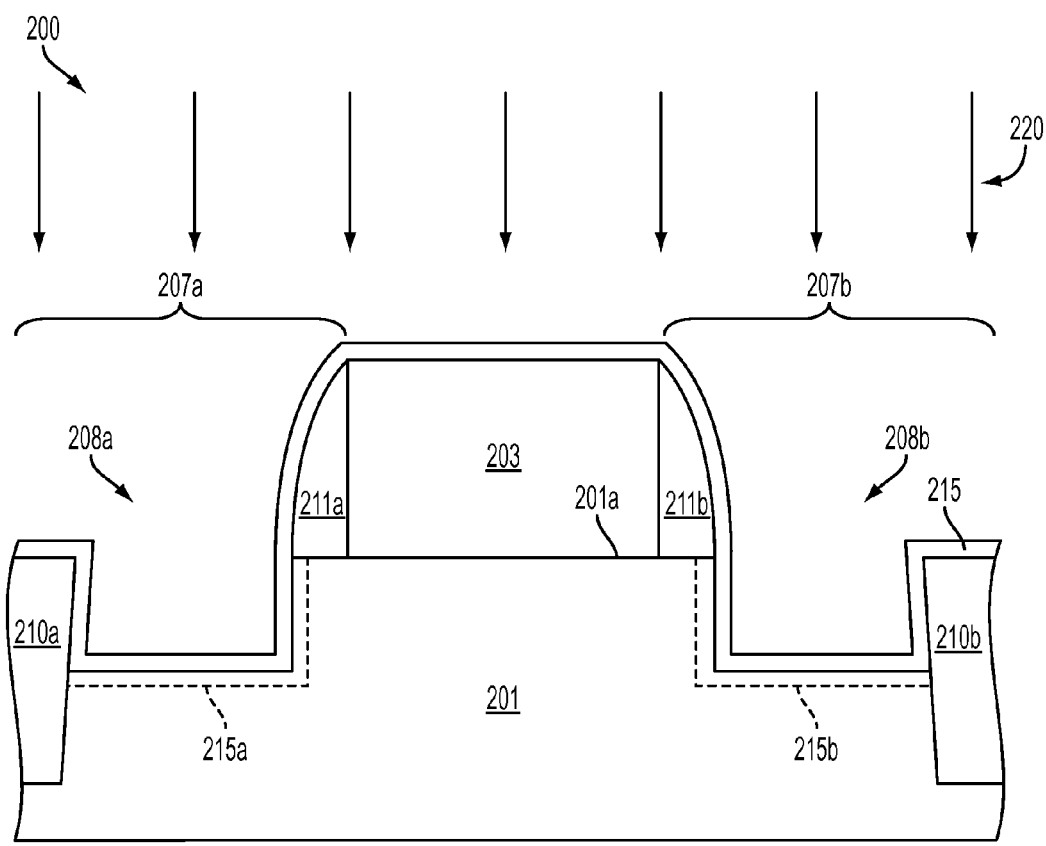

Referring to FIGS. 1 and 2C-2D, the method 100 can include forming a dopant-rich layer having first type dopants on a sidewall and a bottom of each of the recesses (block 130). For example, the block 130 can include forming a dopant-rich layer 215 that can be substantially conformally deposited over the recesses 208a-208b and the gate structure 203 as shown in FIG. 2C. The dopant-rich layer 215 can continuously extend on the spacers 211a, 211b, the gate structure 203 and the sidewalls and the bottom of each of the recesses 208a and 208b. In some embodiments, the dopant-rich layer 215 can be formed by a pulsed plasma doping (PLAD) process or a sub-atmospheric chemical vapor deposition (SACVD) process.

Figure 5:
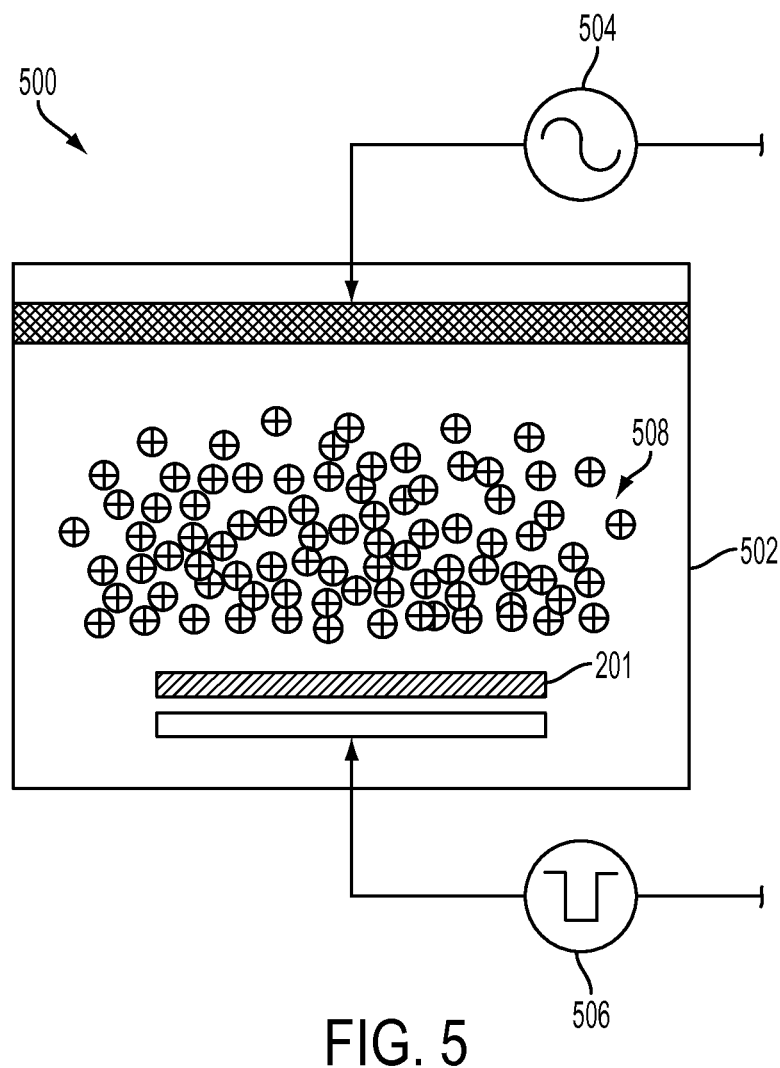
FIG. 5 is a schematic drawing illustrating an exemplary apparatus for a pulsed plasma doping (PLAD) process.

In some embodiments using a PLAD process, the dopant-rich layer 215 can be formed in an apparatus 500 shown in FIG. 5. In some embodiments, the apparatus 500 can include a chamber 502, in which the substrate 201 (FIG. 2A) is placed. The apparatus 500 can include power sources 504 and 506 that are electrically coupled with electrodes (not labeled) that are disposed in the chamber 502. In some embodiments, the power source 504 can be a radio frequency (RF) power source with a programmable pulse modulation function. The power source 506 can be a pulsed direct current (DC) or RF power source for providing a bias voltage on the substrate 201. In some embodiments, the power sources 504 and 506 can be operated independently from each other. Each of the power sources 504 and 506 can be programmed to be independently powered on and off without affecting the other.

Referring again to FIG. 5, plasma 508 can be generated from a process gas in the chamber 502. The process gas can include at least one dopant gas such as arsine ($AsH_3$), diborane ($B_2H_6$), phosphine ($PH_3$), boron trifluoride ($BF_3$), other dopant gases, and/or any combinations thereof, and at least one dilution gas such as Xe, Ar, He, Ne, $H_2$, other dilution gases, and/or any combinations thereof, for forming a predetermined composition of dopant-rich layer 215. In some embodiments, the PLAD process can have a bias voltage substantially equal to or less than about 1.5 KeV, a pressure substantially equal to or larger than about 6 mTorr, and an inductively coupled plasma (ICP) power ranging from about 250 Watt to about 1 KWatt.

In some embodiments, the dopant-rich layer 215 can be referred to as an ion assisted deposition (IAD) layer. In some embodiments forming a halo doped structure, the dopant-rich layer 215 can comprise dopants that are used for doping the halo doped structure. Depending on the conductivity type of the FinFET, in some embodiments, the dopant-rich layer 215 comprises n-type dopants (impurities) or p-type dopants (impurities). In some embodiments forming an N-type FinFET, the dopant-rich layer 215 can comprise boron, indium, and/or other group III elements. In other embodiments forming a P-type FinFET, the dopant-rich layer 215 can comprise phosphorous, arsenic, and/or other group V elements. In some embodiments, the atomic percentage of the dopant in the dopant-rich layer 215 may be substantially equal to or greater than about 90%.

Referring to FIG. 2D, the method 100 can optionally include thermally driving dopants of the dopant-rich layer 215 into the sidewall and bottom of each of the recesses 208a-208b. The thermal driving process 220 can drive the dopants into the substrate 201 to form halo doped regions 215a and 215b.

Figure 2E:
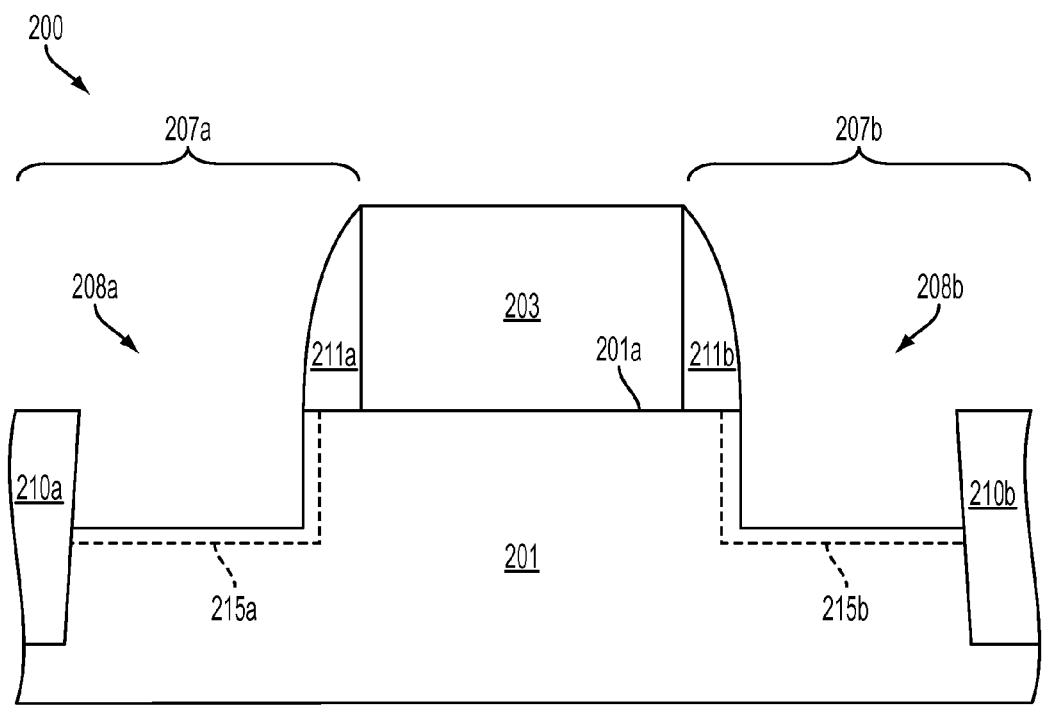

In some embodiments, the method 100 can include removing at least a portion of the dopant-rich layer 215. For example, the dopant-rich layer 215 can be substantially completely removed as shown in FIG. 2E. In at least this embodiment, the halo doped regions 215a and 215b can be referred to as halo doped structures. In other embodiments, the portion of the dopant-rich layer 215 that is over the surface 201a is removed. The remaining dopant-rich layer can continuously extend on the sidewalls and bottom of each of the recesses 208a and 208b. In at least this embodiment, the combination of the halo doped region 215a and the remaining dopant-rich layer can be referred to as a halo doped structure.

Figure 2F:
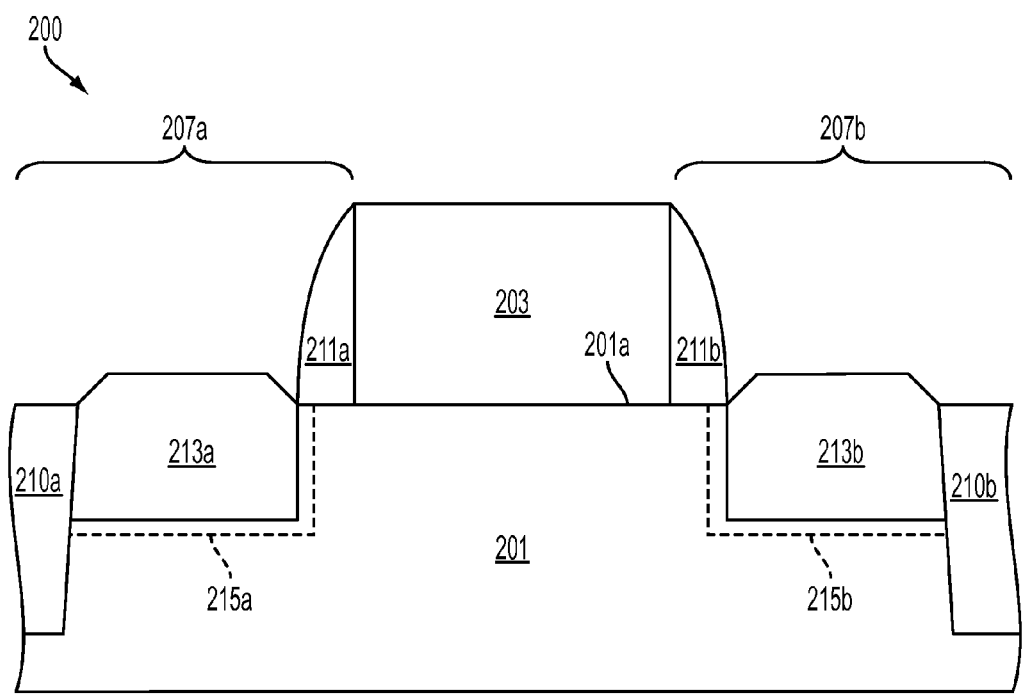

Referring again to FIG. 1, the method 100 can include forming a silicon-containing material structure in each of the recesses (block 140). For example, silicon-containing material structures 213a and 213b can be formed in the recesses 208a-208b, respectively, as shown in FIG. 2F. The silicon-containing material structures 213a-213b each can have a dopant type that is opposite to that of the dopant-rich layer 215.

In some embodiments, the silicon-containing material structure 213a can have an upper potion and a bottom portion (not labeled). The upper portion can be adjacent to the surface 201a of the substrate. The bottom portion is farther away from the surface 201a than the upper portion. The upper portion can have a dopant concentration which is higher than that of the bottom portion. In other embodiments, the silicon-containing material structure 213a can have a dopant profile that gradually increases from the bottom portion to the upper potion. In yet other embodiments, the dopant concentration of the upper portion of the silicon-containing material structure 213a can be higher than that of the halo doped region 215a. In yet still other embodiments, the dopant concentration of the bottom potion of the silicon-containing material structure 213a can be lower than that of the halo doped region 215a.

In some embodiments, the silicon-containing material structures 213a and 213b can be formed by epitaxially depositing at least one silicon-containing material in the recesses 208a and 208b, respectively. Though the silicon-containing material structures 213a and 213b each show a single structure, the scope of this application is not limited thereto. In some embodiments, the silicon-containing material structures 213a and 213b each can be formed by multiple epitaxial depositions. The multiple epitaxial depositions each may have different dopant dosages.

In some embodiments forming an N-type transistor, the silicon-containing material structures 213a and 213b can be made of at least one material, such as silicon, silicon carbide, other semiconductor materials, and/or any combinations thereof. In other embodiments forming a P-type transistor, the silicon-containing material structures 213a and 213b can be made of at least one material, such as silicon, silicon germane, other semiconductor materials, and/or any combinations thereof.

In some embodiments, the silicon-containing material structures 213a and 213b can be formed by chemical vapor deposition (CVD), e.g., metalorganic CVD (MOCVD), low pressure CVD (LPCVD), atomic layer CVD (ALCVD), ultrahigh vacuum CVD (UHVCVD), reduced pressure CVD (RPCVD), any suitable CVD; molecular beam epitaxy (MBE) process; any suitable epitaxial process; or any combinations thereof.

In some embodiments, the deposition of the silicon-containing material structures 213a and 213b can include in-situ doping the silicon-containing material structures 213a and 213b. For example, forming an N-type transistor can use an N-type doping precursor, e.g., phosphine ($PH_3$) and/or other N-type doping precursor. By using the in-situ doping process, the dopant profile of the silicon-containing material structures 213a and 213b can be desirably achieved. In some embodiments, the silicon-containing material structures 213a and 213b can be an N-type doped silicon layer that is doped with phosphorus. The phosphorus-doped silicon layer can be referred to as a silicon phosphorus (SiP) layer.

Figure 2G:
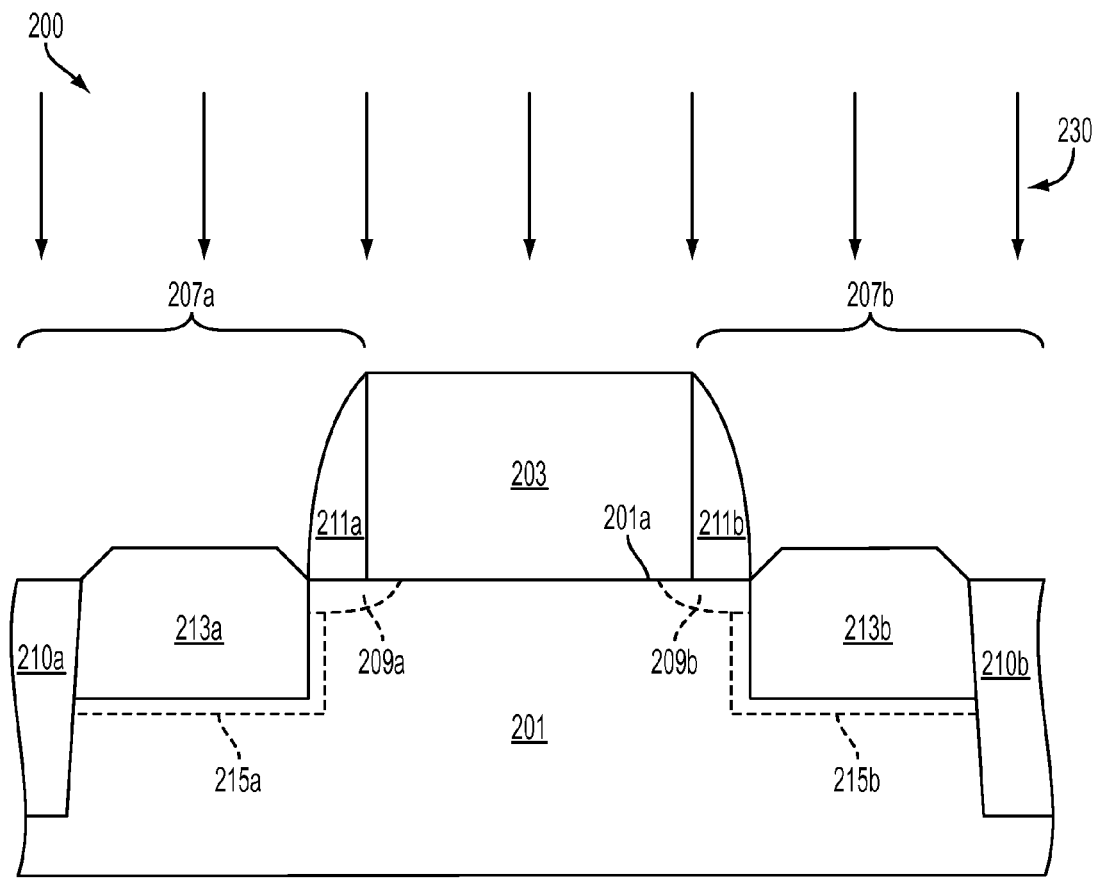

In some embodiments, the method 100 can optionally include thermally driving dopants of the silicon-containing material structure into the sidewall and the bottom of each of the recesses. For example, a thermal driving process 230 can drive dopants of the silicon-containing material structures 213a and 213b into the sidewall and the bottom of each of the recesses 208a-208b as shown in FIG. 2G. In some embodiments, the dopant concentration of the upper potions of the silicon-containing material structures 213a and 213b can be higher than that of the halo doped regions 215a and 215b, respectively. The dopants of the upper portions of the silicon-containing material structures 213a and 213b can compensate the dopants of the halo doped regions 215a and 215b, respectively, at the regions that are adjacent to the surface 201a so as to form lightly-doped drains (LDDs) 209a and 209b in the substrate 201. The LDDs 209a and 209b can have the same dopant type as the silicon-containing material structures 213a and 213b. In some embodiments, the LDDs 209a and 209b can be referred to as S/D extensions.

In some embodiments, the thermal driving process 230 can include a rapid thermal annealing (RTA) process. The RTA process can activate the dopants of the silicon-containing material structures 213a and 213b. In some embodiments, the RTA process can have a spike annealing temperature of about 1010° C. or lower. In some embodiments, silicide (not shown), e.g., nickel silicide, can be formed on the silicon-containing material structures 213a and 213b.

In some other embodiments, a remaining dopant-rich layer can be kept on the sidewalls and the bottom of each of the recesses 208a-208b as described above in conjunction with FIG. 2E. The thermal driving process 230 can drive dopants of the silicon-containing material structures 213a and 213b into the respective remaining dopant-rich layer.

As noted, the method 100 includes forming the dopant-rich layer and the silicon-containing material structure to form the halo doped regions, the LDDs, and the S/D doped regions. Since forming the dopant-rich layer and forming the silicon-containing material structure do not use any ion implantation process. Predetermined dopant profiles of the halo doped regions and the S/D doped regions can be achieved.

As also noted, the LDDs 209a and 209b are not formed by an ion implantation process. End-of-range defects resulting from ion implantation through a dielectric layer can be avoided. Yields impaired by the end-of-range defects can be reduced.

Figure 3:
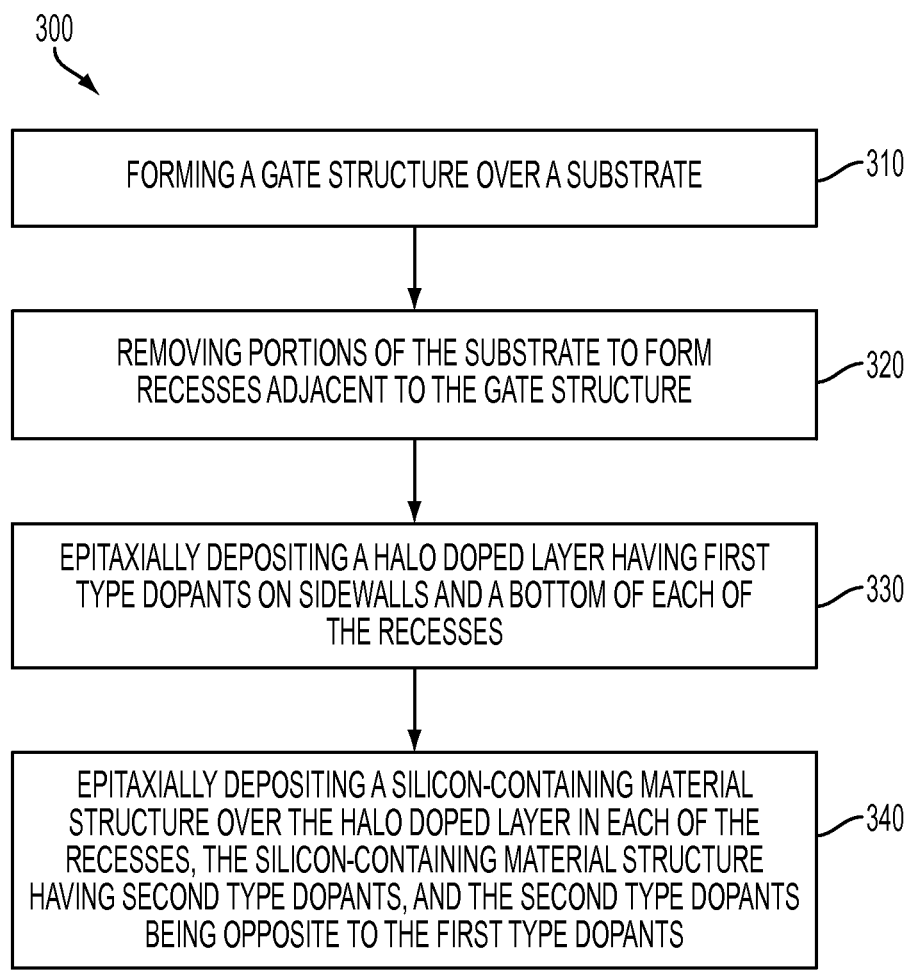
FIG. 3 is a flowchart illustrating another exemplary method of forming an integrated circuit in accordance with some embodiments.

Illustrated in FIG. 3 is a flowchart of another exemplary method of forming an integrated circuit. FIGS. 4A-4E are schematic cross-sectional views of an integrated circuit during various fabrication stages. Items of FIGS. 4A-4E that are the same or similar items in FIGS. 2A-2F are indicated by the same reference numerals, increased by 200.

Referring now to FIG. 3, the method 300 can include forming a gate structure over a substrate (block 310). The method 300 can include removing portions of the substrate to form recesses adjacent to the gate structure (block 320). The method 300 can include epitaxially depositing a halo doped layer having first type dopants on sidewalls and a bottom of each of the recesses (block 330). The method 300 can also include epitaxially depositing a silicon-containing material structure over the halo doped layer in each of the recesses (block 340). The silicon-containing material structure has second type dopants. The second type dopants are opposite to the first type dopants.

Figure 4A:
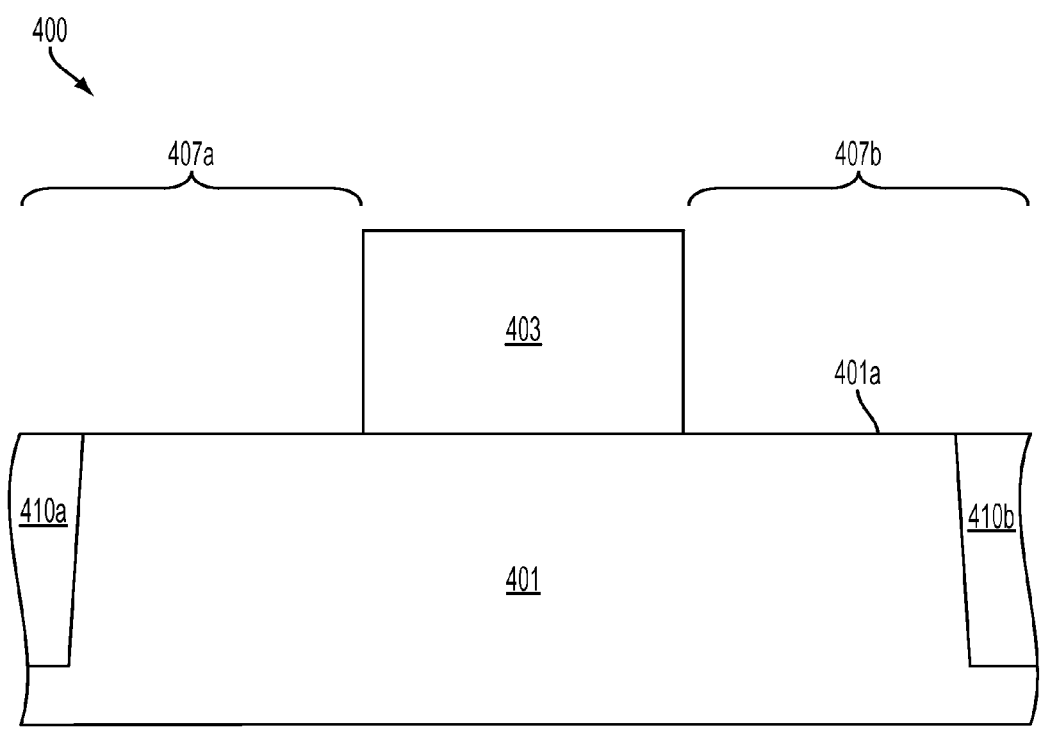
FIGS. 4A-4E are schematic cross-sectional views of an integrated circuit during various fabrication stages according to the method depicted in FIG. 3.
Figure 4B:
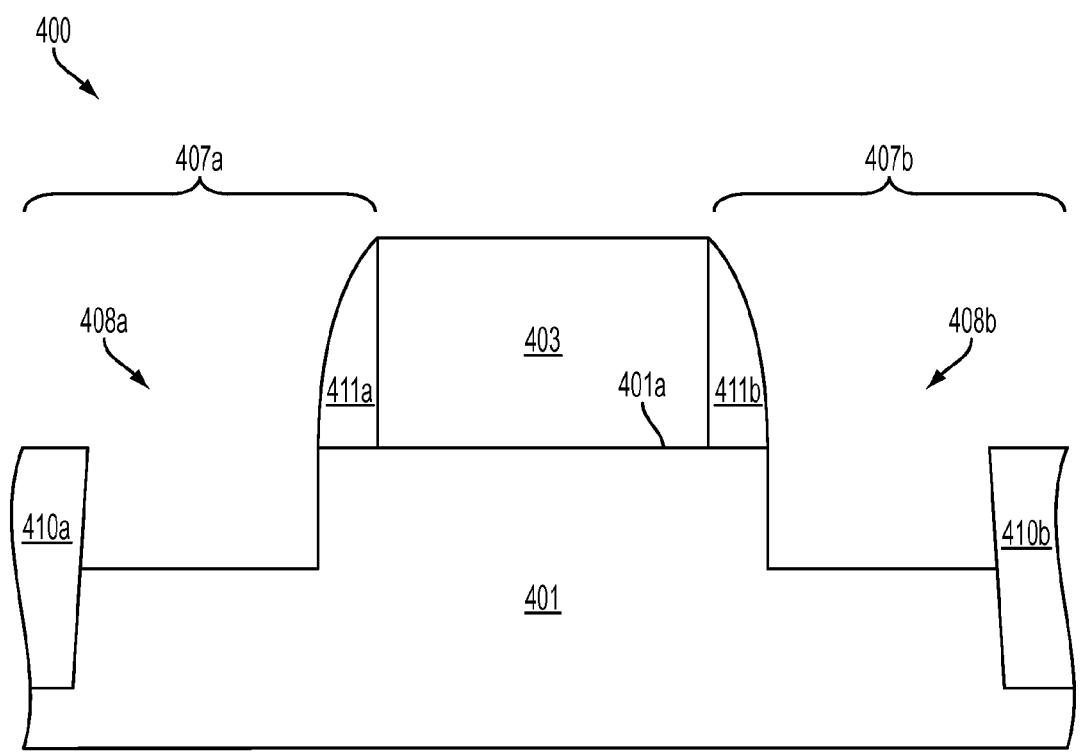

Referring now to FIGS. 4A-4E in conjunction with FIG. 3, an integrated circuit 400 can be fabricated in accordance with the method 300 of FIG. 3. For example, a gate structure 403 can be formed over a substrate 401 as shown in FIG. 4A. STI features 410a-410b can be formed in the substrate 401. Referring to FIG. 4B, recesses 408a and 408b can be formed in the S/D regions 407a and 407b, respectively. Spacers 411a and 411b can be formed on sidewalls of the gate structure 403.

Figure 4C:
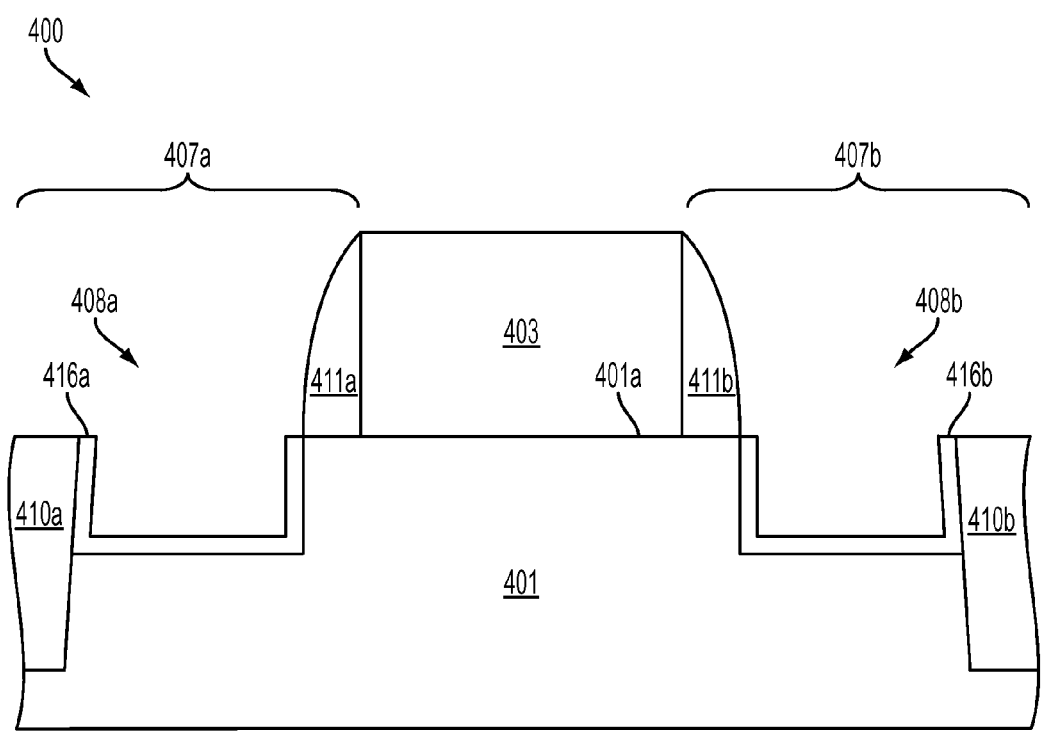

Referring to FIG. 3, the method 300 can include epitaxially depositing a halo doped layer having first type dopants on sidewalls and a bottom of each of the recesses (block 130). For example, halo doped layers 416a and 416b can be epitaxially deposited on sidewalls and a bottom of each of the recesses 408a and 408b, respectively, as shown in FIG. 4C. In some embodiments, the halo doped layers 416a and 416b can be selectively grown from exposure regions of the substrate 401. Due to the selective deposition, the halo doped layers 416a and 416b is not formed on the STI features 410a-410b and the spacers 411a-411b.

In some embodiments, the halo doped layers 416a and 416b can be formed by chemical vapor deposition (CVD), e.g., metalorganic CVD (MOCVD), low pressure CVD (LPCVD), atomic layer CVD (ALCVD), ultrahigh vacuum CVD (UHVCVD), reduced pressure CVD (RPCVD), any suitable CVD; molecular beam epitaxy (MBE) process; any suitable epitaxial process; or any combinations thereof.

In some embodiments, the deposition of the halo doped layers 416a and 416b can include in-situ doping the halo doped layers 416a and 416b. In some embodiments for forming an N-type transistor, the halo doped layers 416a and 416b can be in-situ doped with boron and/or other group III elements. In other embodiments for forming a P-type transistor, the halo doped layers 416a and 416b can be in-situ doped with phosphorous, arsenic, and/or other group V elements.

Figure 4D:
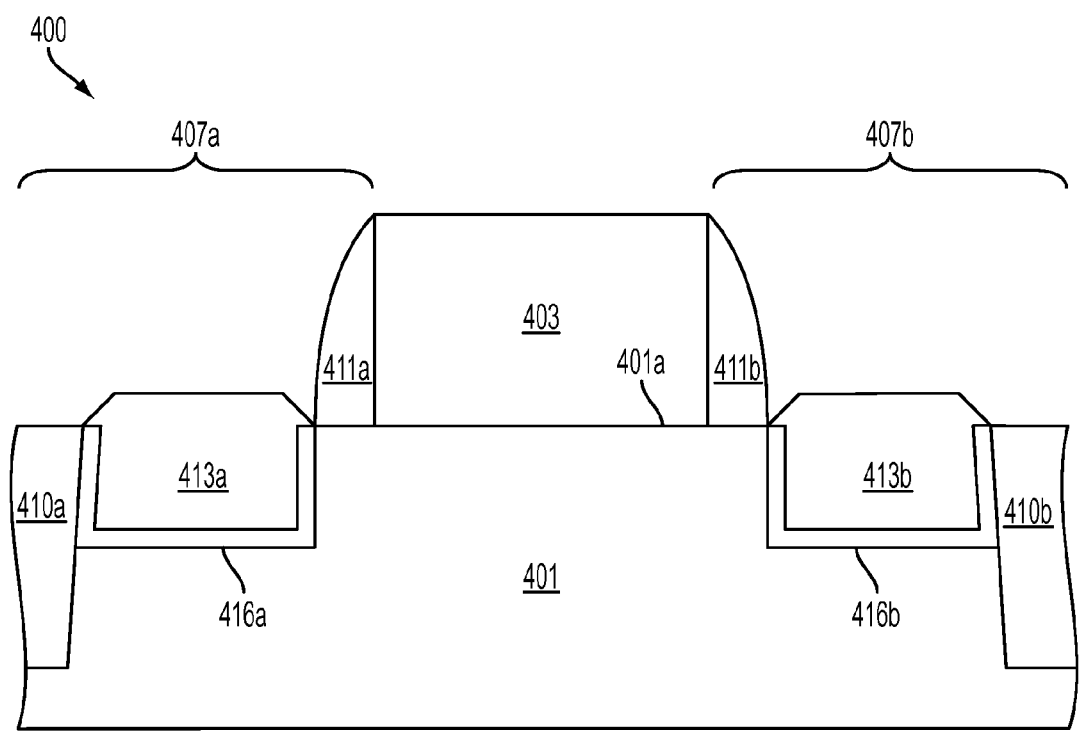

Referring again to FIG. 3, the method 300 can include epitaxially depositing a silicon-containing material structure over the halo doped layer in each of the recesses (block 340). For example, silicon-containing material structures 413a and 413b can be epitaxially deposited over the halo doped layers 416a and 416b, respectively, as shown in FIG. 4D. The silicon-containing material structures 413a-413b can each have a dopant type that is opposite to that of the halo doped layers 416a and 416b.

In some embodiments, the silicon-containing material structure 413a can have an upper potion and a bottom portion (not labeled). The upper portion can be adjacent to the surface 401a of the substrate 401. The bottom portion is farther away from the surface 401a than the upper portion. The upper portion can have a dopant concentration which is higher than that of the bottom portion. In other embodiments, the silicon-containing material structure 413a can have a dopant profile that gradually increases from the bottom portion to the upper potion. In yet other embodiments, the dopant concentration of the upper portion of the silicon-containing material structure 413a can be higher than that of the halo doped layer 416a. In yet still other embodiments, the dopant concentration of the bottom potion of the silicon-containing material structure 413a can be lower than that of the halo doped layer 416a.

Figure 4E:
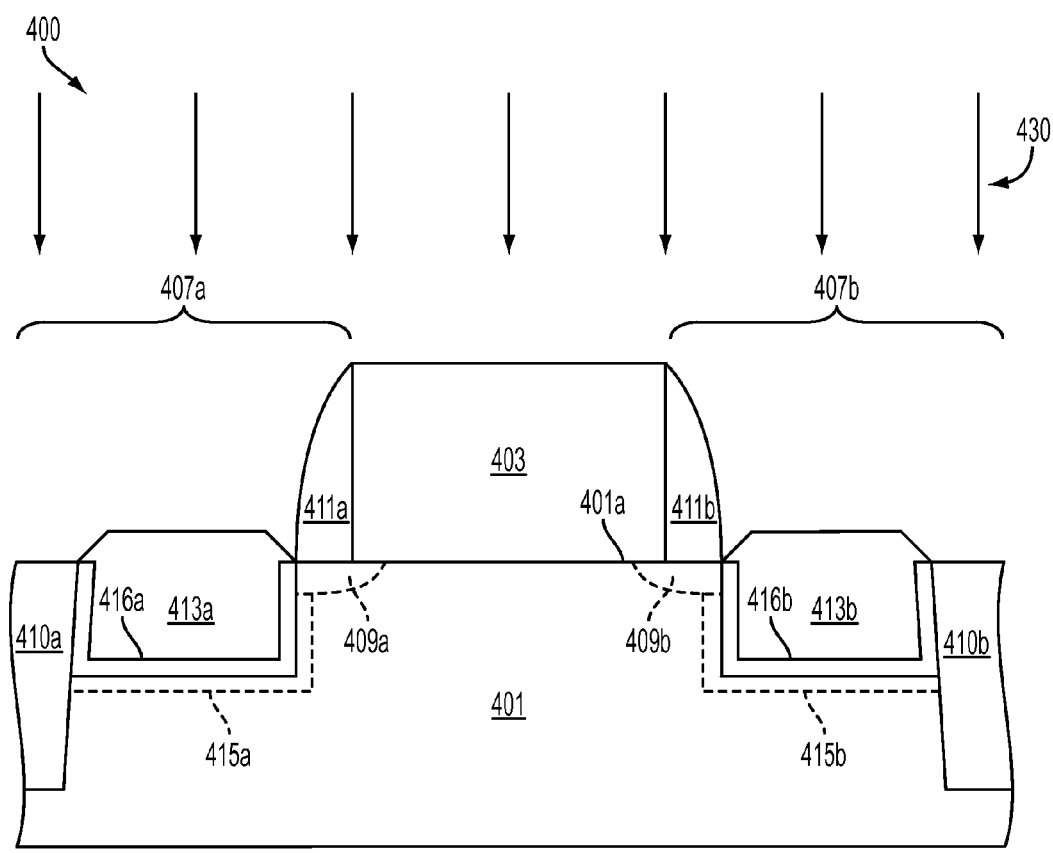

Referring to FIG. 4E, the method 400 can optionally include thermally driving dopants of the silicon-containing material structure into the halo doped layers. For example, a thermal driving process 430 can drive dopants of the silicon-containing material structures 413a and 413b into the halo doped layers 416a and 416b as shown in FIG. 4E. The thermal driving process 430 can also drive dopants of the halo doped layers 416a and 416b into the substrate 401 to form the halo doped regions 415a and 415b.

In some embodiments, the dopant concentration of the upper potions of the silicon-containing material structures 413a and 413b can be higher than that of the halo doped layers 416a and 416b, respectively. The dopants of the upper portions of the silicon-containing material structures 413a and 413b can compensate the dopants of the halo doped layers 416a and 416b, respectively, at the regions that are adjacent to the surface 401a so as to form lightly-doped drains (LDDs) 409a and 409b in the substrate 401. The LDDs 409a and 409b can have the same dopant type as the silicon-containing material structures 413a and 413b. In some embodiments, the LDDs 409a and 409b can be referred to as S/D extensions.

As also noted, the method 400 includes epitaxially depositing the halo doped layer and the silicon-containing material structure that serves as the S/D doped region. Since epitaxially depositing the halo doped layer and forming the silicon-containing material structure do not use any ion implantation process. Predetermined dopant profiles of the halo doped layer and the S/D doped region can be achieved.

As noted, the processes of the methods 100 and 300 described above in conjunction with FIGS. 1 and 3 are merely exemplary. The methods 100 and 300 can each include different steps according to different process flows. For example, the gate structures 203 and 403 can each be formed by a gate-first process or a gate-last process. In some embodiments using a gate-last process, the methods 100 and 300 can each include a gate replacing process. The gate structures 203 and 403 can each be a dummy gate structure. The dummy gate structure can include a dummy gate material and a hard mask material formed thereover. The dummy gate material can be made of at least one material such as polysilicon, amorphous silicon, silicon oxide, silicon nitride, or a material having an etching rate that is substantially different from the spacers.

For the gate-last process, the hard mask materials and the dummy gate materials can be removed, for example, by a wet etch process, a dry etch process, or any combinations thereof. After removing the dummy gate materials, the methods 100 and 300 can each include forming gate electrode material within openings in which the dummy gate materials are disposed. In some embodiments, the gate electrode material can be a stack structure including a diffusion barrier layer, a metallic work function layer, a metallic conductive layer, and/or other suitable material layers.

In some embodiments, at least one high dielectric constant (high-k) layer (not shown) can be formed under the gate electrode material. The high-k dielectric layer can include high-k dielectric materials such as $HfO_2$, HfSiO, HfSiON, HfTaO, HfSiO, HfZrO, other suitable high-k dielectric materials, or any combinations thereof. In some embodiments, the high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, or any combinations thereof.

In some embodiments, the diffusion barrier can be configured to prevent metallic ions of the work function metal material from diffusing into the gate dielectric material. The diffusion barrier may comprise at least one material such as aluminum oxide, aluminum, aluminum nitride, titanium, titanium nitride (TiN), tantalum, tantalum nitride, other suitable material, and/or combinations thereof.

In some embodiments, the metallic work function layer can include at least one P-metal work function layer and/or at least one N-metal work function layer. The P-type work function materials can include one or more of ruthenium, palladium, platinum, cobalt, nickel, and conductive metal oxides, and/or other suitable materials. The N-type metal materials can include one or more of hafnium, zirconium, titanium, tantalum, aluminum, metal carbides (e.g., hafnium carbide, zirconium carbide, titanium carbide, aluminum carbide), aluminides, and/or other suitable materials. In some embodiments, the metallic conductive layer can be made of at least one material, such as aluminum, copper, Ti, TiN, TaN, Ta, TaC, TaSiN, W, WN, MoN, MoON, $RuO_2$, and/or other suitable materials.

In some embodiments, dielectric materials, contact plugs, via plugs, metallic regions, and/or metallic lines (not shown) can be formed over the gate electrode portions for interconnection. The dielectric layers may include materials such as silicon oxide, silicon nitride, silicon oxynitride, low-k dielectric material, ultra low-k dielectric material, or any combinations thereof. The via plugs, metallic regions, and/or metallic lines can include materials such as tungsten, aluminum, copper, titanium, tantalum, titanium nitride, tantalum nitride, nickel silicide, cobalt silicide, other proper conductive materials, and/or combinations thereof. The via plugs, metallic regions, and/or metallic lines can be formed by any suitable processes, such as deposition, photolithography, and etching processes, and/or combinations thereof.

In accordance with at least one embodiment, a semiconductor structure includes a substrate, a gate structure, and two silicon-containing structures. The substrate includes two recesses defined therein and two doping regions of a first dopant type. Each of the two doping regions extends along a bottom surface and at least portion of a sidewall of a corresponding one of the two recesses. The gate structure is over the substrate and between the two recesses. The two silicon-containing structures are of a second dopant type different from the first dopant type. Each of the two silicon-containing structures fills a corresponding one of the two recesses, and an upper portion of each of the two silicon-containing structures has a dopant concentration higher than that of a lower portion of each of the two silicon-containing structures.

In accordance with at least another embodiment, a semiconductor structure includes a substrate, a gate structure, and two silicon-containing structures. The substrate includes two recesses defined therein and two epitaxial layers of a first dopant type extending along corresponding bottom surfaces and sidewalls of the two recesses. The gate structure is over the substrate and between the two recesses. The two silicon-containing structures are of a second dopant type different from the first dopant type. Each of the two silicon-containing structures fills a corresponding one of the two recesses, and the silicon-containing structures are separated from directly contacting the substrate by the epitaxial layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
    a substrate comprising:
        two recesses defined therein; and
        two doped regions of a first dopant type, each of the two doped regions extending along a bottom surface and at least portion of a sidewall of a corresponding one of the two recesses;
    two halo doped layers of the first dopant type, one halo doped layer of the two halo doped layers being over one doped region of the two doped regions and the other halo doped layer of the two halo doped layers being over a different doped region of the two doped regions;
    a gate structure over the substrate and between the two recesses;
    two silicon-containing structures of a second dopant type different from the first dopant type, each of the two silicon-containing structures formed over different ones of the two halo doped layers of the first dopant type and filling a corresponding one of the two recesses, and an upper portion of each of the two silicon-containing structures having a dopant concentration higher than that of a lower portion of each of the two silicon-containing structures; and
    two lightly-doped drain (LDD) regions of the second dopant type under the gate structure, the two LDD regions extending from a corresponding one of the sidewalls of the two recesses toward each other along an upper surface of the substrate,
    wherein at least one sidewall of at least one recess of the two recesses is orthogonal to the bottom surface of the at least one recess, and at least one of the two halo doped layers conformally overlies the at least one sidewall orthogonal to the bottom surface and the bottom surface of the at least one recess.

2. The semiconductor structure of claim 1, wherein the dopant concentration at the upper portion of one of the silicon-containing structure is higher than a dopant concentration of a corresponding one of the doped regions.

3. The semiconductor structure of claim 1, wherein the dopant concentration at the lower portion of one of the silicon-containing structure is lower than the dopant concentration of the corresponding one of the doped regions.

4. The semiconductor structure of claim 1, wherein the two silicon-containing structures comprise phosphorus-doped silicon.

5. The semiconductor structure of claim 1, wherein one of the two silicon-containing structures has a dopant profile that dopant concentration gradually increases from the bottom portion to the upper portion of the one of the two silicon-containing structures.

6. The semiconductor structure of claim 1, further comprising two isolation structures, and the recesses are between the two isolation structures.

7. The semiconductor structure of claim 1, wherein the silicon-containing structures are epitaxial semiconductor structures.

8. A semiconductor structure comprising:
    a substrate comprising:
        two recesses defined therein; and
        two doped regions of a first dopant type extending along corresponding bottom surfaces and sidewalls of the two recesses;

two halo doped layers of the first dopant type, each of the two halo doped layers formed epitaxially over different ones of the two doped regions of the first dopant type;

a gate structure over the substrate and between the two recesses;

two silicon-containing structures of a second dopant type different from the first dopant type, each of the two silicon-containing structures formed over different ones of the two halo doped layers of the first dopant type and filling a corresponding one of the two recesses, and the silicon-containing structures being separated from directly contacting the substrate by the epitaxial layers; and two lightly-doped drain (LDD) regions of the second dopant type under the gate structure, the two LDD regions extending from a corresponding one of the sidewalls of the two recesses toward each other along an upper surface of the substrate, wherein at least one sidewall of at least one recess of the two recesses is orthogonal to the bottom surface of the at least one recess, and at least one of the two halo doped layers conformally overlies the at least one sidewall orthogonal to the bottom surface and the bottom surface of the at least one recess.

9. The semiconductor structure of claim 8, wherein one of the two silicon-containing structures have a dopant concentration at an upper portion thereof higher than that of a lower portion thereof.

10. The semiconductor structure of claim 9, wherein the other one of the two silicon-containing structures have a dopant concentration at an upper portion thereof higher than that of a lower portion thereof.

11. The semiconductor structure of claim 9, wherein the one of the two silicon-containing structures has a dopant profile that dopant concentration gradually increases from the bottom portion to the upper portion of the one of the two silicon-containing structures.

12. The semiconductor structure of claim 8, wherein the two silicon-containing structures comprise phosphorus-doped silicon.

13. The semiconductor structure of claim 8, further comprising two isolation structures, and the recesses are between the two isolation structures.

14. The semiconductor structure of claim 8, wherein the dopant concentration at the upper portion of one of the silicon-containing structure is higher than a dopant concentration of a corresponding one of the epitaxial layers.

15. The semiconductor structure of claim 8, wherein the dopant concentration at the lower portion of one of the silicon-containing structure is lower than the dopant concentration of the corresponding one of the epitaxial layers.

16. The semiconductor structure of claim 8, wherein the silicon-containing structures are epitaxial semiconductor structures.

* * * * *